United States Patent [19]

Shirasaki

[11] Patent Number: 4,996,574

[45] Date of Patent: Feb. 26, 1991

[54] MIS TRANSISTOR STRUCTURE FOR INCREASING CONDUCTANCE BETWEEN SOURCE AND DRAIN REGIONS

[75] Inventor: Masahiro Shirasaki, Kawasaki, Japan

[73] Assignee: Fujitsu Limited, Kawasaki, Japan

[21] Appl. No.: 374,293

[22] Filed: Jun. 30, 1989

[30] Foreign Application Priority Data

Jul. 1, 1988 [JP] Japan ................................ 63-164152

[51] Int. Cl.⁵ ............................................. H01L 29/78
[52] U.S. Cl. ................................. 357/23.7; 357/23.14;
357/55; 357/56; 357/23.1; 357/2; 357/4
[58] Field of Search ...................... 357/23.14, 23.7, 55,
357/56, 23.1, 2, 4

[56] References Cited

U.S. PATENT DOCUMENTS 4,425,572   1/1984   Takafuji et al. ..................... 357/23.7

FOREIGN PATENT DOCUMENTS 2458227   6/1976   Fed. Rep. of Germany ........ 357/23
63-15469   1/1988   Japan ................................... 357/23.7
63-15471   1/1988   Japan ................................... 357/23.7

OTHER PUBLICATIONS

Colinge, "Subthreshold Slope of Thin-Film Soi Mosfet's", IEEE Electron Device Letters, vol. EDL-7, No. 4, Apr. 1986.

Primary Examiner—Rolf Hille
Assistant Examiner—Steven Loke
Attorney, Agent, or Firm—Staas & Halsey

[57] ABSTRACT

A metal-insulator-semiconductor transistor comprises an insulator layer, a semiconductor body provided on the insulator layer and comprising a source region, a drain region and a channel region extending in a first direction between and interconnecting the source region and the drain region, a gate insulator film provided on the semiconductor body so as to cover the channel region except for the part of the channel region in contact with the insulator layer, and a gate electrode of a conductive material provided in contact with the gate insulator film so as to cover the channel region underneath the gate insulator film except for the part of the channel region in contact with the insulator layer. The channel region has a width substantially smaller than twice the maximum extension of the depletion region formed in the channel region.

13 Claims, 8 Drawing Sheets $Wo < 2Wmax$ $W_O < 2W_{max}$ 4,996,574

MIS TRANSISTOR STRUCTURE FOR INCREASING CONDUCTANCE BETWEEN SOURCE AND DRAIN REGIONS

BACKGROUND OF THE INVENTION

The present invention generally relates to field effect transistors and more particularly to a metal-insulator-semiconductor (MIS) transistor having increased conductance between the source and drain regions.

Typical MOS transistors uses a semiconductor substrate in which a source region and a drain region are defined in the semiconductor substrate at opposite sides of a channel region also defined in the substrate. A gate insulator is provided on the channel region and a gate electrode is provided on the gate insulator and thus above the channel region. When a number of such MOS transistors are assembled on a common semiconductor substrate, as in the case of a large scale integrated circuit (LSI), there appears a leakage path between the MOS transistors formed in the substrate. Such a leakage path deteriorates the operation of the MOS transistors and hence the operation of the integrated circuit.

In a conventional LSI, the MOS transistors are isolated from each other by providing a field insulator region between the transistors. Such an insulator region is formed by oxidization of surface of the substrate. However, the field insulator region for isolating the MOS transistor occupies a large area on the substrate and presents the problem that the number of the MOS transistors which can be assembled on the LSI is reduced.

On the other hand, there is another type of MOS transistor having a so-called semiconductor-on-insulator (SOI) structure in which the transistor is formed on an insulator. Referring to FIG. 1 showing a typical example of such a MOS transistor having the SOI structure, the transistor comprises a silicon single crystal film 1 provided in the form of an island on an insulator layer 2 formed on a substrate 3. Because of this reason, the silicon single crystal film 1 will be referred to as a silicon island 1. The silicon island 1 is divided into a source region 1a and a drain region 1b with a channel region therebetween which is covered by a gate insulator 4. Further, a gate electrode 5 is provided so as to cover the gate insulator 4. The gate electrode 5 extends from the silicon island 1 and forms a gate contact area 5' on the insulator layer 2 for contact with a wiring electrode. In such an SOI structure, each MOS transistor is provided on the insulator layer 2 and the problem of isolation of plural transistors is eliminated.

FIG. 2 shows a cross section of the silicon island 1 taken along a line 3—3', of FIG. 1. Referring to FIG. 2, a channel 4a for passing carriers through the silicon island 1 from the source region 1a to the drain region 1b (see FIG. 1) is formed immediately below the gate insulator 4. It should be noted that the gate width which is defined as the width of the silicon island 1 measured perpendicularly to the gate length of the MOS transistor, is represented by $W_O$ and the height of the gate defined as the height of the silicon island 1, is represented by $W_H$.

In such a conventional MOS transistor having the SOI structure, there is a problem in that the total current which can flow between the source region and the drain region is limited by the cross sectional area of the channel 4a. As the channel 4a is formed immediately below the gate insulator 4 in the form of thin layer, the overall cross sectional area of the channel 4a is approximated by the total gate width WG which is represented by using the gate width $W_O$ and the gate height $W_H$, as $WG = W_O + 2W_H$. In order to increase the current or the conductance between the source and of the gate width $W_O$ or the size of the gate height $W_H$. However, such an increase results in an increase in the size of the MOS transistor which is undesirable from the view point of assembling the MOS transistors in an LSI form.

FIG. 3 shows another prior art MOS transistor proposed to solve the aforementioned problem. In FIG. 3, parts corresponding to those parts in the preceding drawings are given identical reference numerals and the description thereof will be omitted.

Referring to FIG. 3 showing the cross section of this another prior art MOS transistor device, there is provided another gate electrode 6 directly on the insulator layer 2 which in turn is formed on the substrate 3 similarly to the previous case. The gate electrode 6 is buried under an insulator layer 7 and a silicon island 10 is provided on the insulator layer 7. The silicon island 10 is covered by the gate insulator 4 except for its bottom surface, which is in contact with the insulator layer 7 and a pair of doped regions 10a and 10b, which are formed in the silicon island 10 as the source and drain regions. These source and drain regions 10a and 10b are connected to wiring electrodes through respective contact holes (not shown) provided in the gate insulator 4. Similarly to the device of FIG. 1, the gate electrode 5 is provided on the gate insulator 4. Further, the silicon island 10 is buried under an insulator layer 8 together with the gate insulator 4 and the gate electrode 5.

In this prior art transistor, there is formed a channel 4b along the bottom of the silicon island 10 in correspondence to the gate electrode 6 and another channel 4c along the top of the silicon island 10 in correspondence to the gate electrode 5. As the channels are formed along the top and bottom of the silicon island 1, the overall cross sectional area of the channel is nearly doubled and the conductance of the MOS transistor is increased correspondingly.

However, even with such a structure, it is easily understood that there is a practical limitation in the increase in the conductance of the transistor because of the resulting excessive increase in the size of the transistor. Further, such a transistor has a problem in that the structure becomes complex and needs many steps in manufacturing.

SUMMARY OF THE INVENTION

Accordingly, it is a general object of the present invention to provide a novel and useful MIS transistor wherein the aforementioned problems are eliminated.

Another object of the present invention is to provide a MIS transistor wherein the conductance between a source region and a drain region is substantially increased, but with a simultaneous decrease in the size of the MIS transistor.

Another object of the present invention is to provide a MIS transistor comprising an isolated silicon body defined with a source region, a drain region and a channel region, wherein the isolated silicon body has a width ($W_O$), measured perpendicularly to a direction connecting the source region and which is the drain region, set to be substantially smaller than twice the maximum extension ($W_{MAX}$) of the depletion region in the channel region ($W_O < 2W_{MAX}$). According to the present invention, the threshold voltage of the MIS transistor is decreased substantially and the carrier concentration level in the channel formed in the channel region when the MIS transistor is in the turned on state is substantially increased. As a result, the conductance of the transistor between the source and drain regions when the transistor is in the turned on state is substantially increased while at the same time the size of the MIS transistor is reduced.

Other objects and further features of the present invention will become apparent from the following detailed description when read in conjunction with attached drawings.

DETAILED DESCRIPTION

Figure 1:
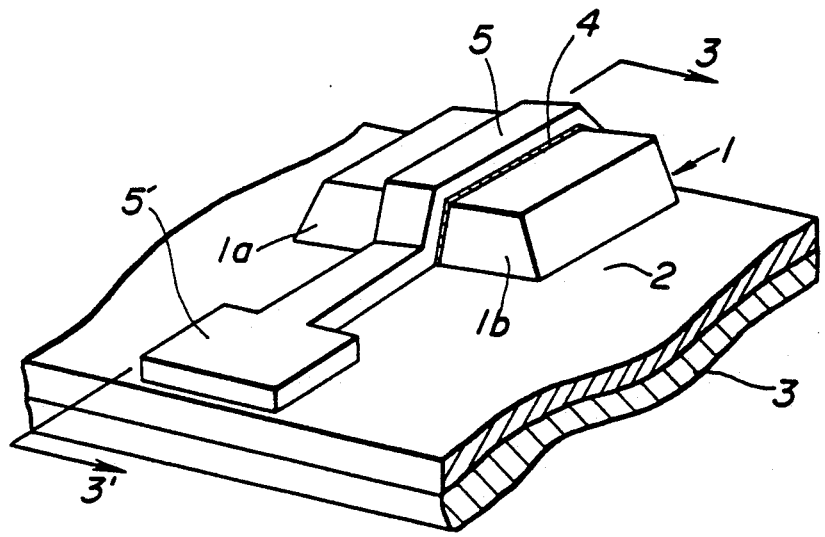
FIG. 1 is a perspective view showing a prior art MOS transistor having a typical SOI structure.
Figure 2:
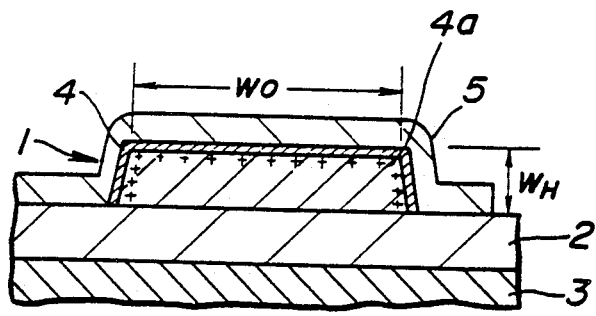
FIG. 2 is a cross sectional view of the transistor of FIG. 1 taken in a plane along a line 3—3' in the drawing.
Figure 3:
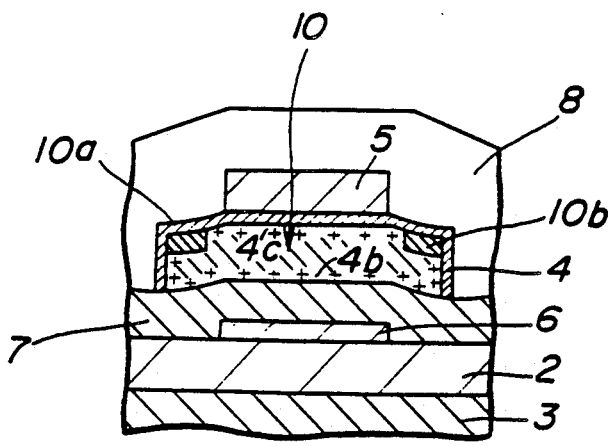
FIG. 3 is a cross sectional view showing another prior art MOS transistor having the SOI structure.
Figure 4:
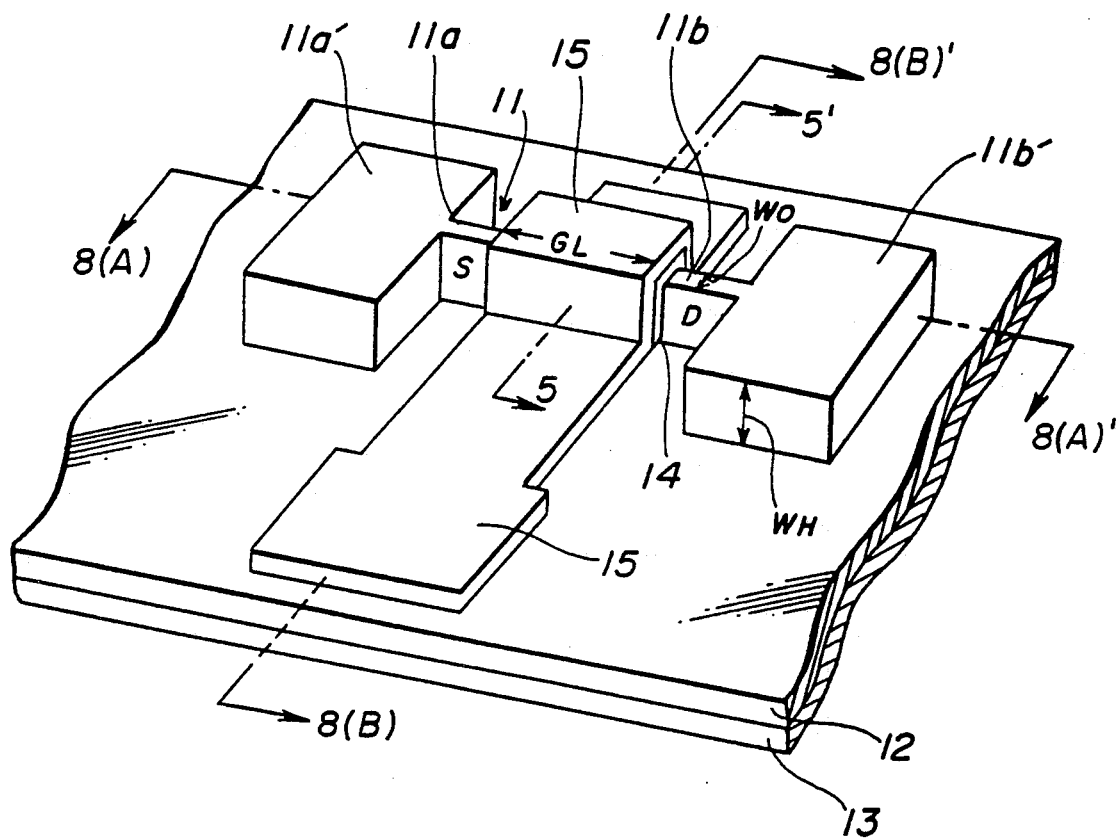
FIG. 4 is a perspective view showing a first embodiment of the MIS transistor according to the present invention.

FIG. 4 shows a first embodiment of the MIS transistor of the present invention. In the description.. hereinafter, the description will be given for a MOS transistor which uses an oxide film for the gate insulator. However, the present invention is by no means limited to the MOS transistor but is applicable in general as well to the MIS transistor using a non-oxide insulating material for the gate insulator.

Referring to the drawing, the transistor is a p-channel type MOS transistor and comprises an isolated silicon body 11 provided on a silicon oxide insulator layer 12 which in turn is provided on a silicon substrate 13. The silicon body 11 comprises a source region 11a doped to the p+-type, a drain region 11b also doped to the p+-type and a channel region 11c (not shown in FIG. 4, see FIG. 5) doped to the n-type and is located between the source region 11a and the drain region 11b. In the example illustrated, the carrier concentration level in the channel region 11c is set to about $3 \times 10^{15}$ cm$^{-3}$. Further, a source contact region 11a' and a drain contact region 11b' are connected respectively to the source region 11a and the drain region 11b for contact with wiring electrodes (not shown). For this purpose, each of the source contact region 11a' and the drain contact region 11b' has an enlarged area forming, affording a connection pad.

Figure 5:
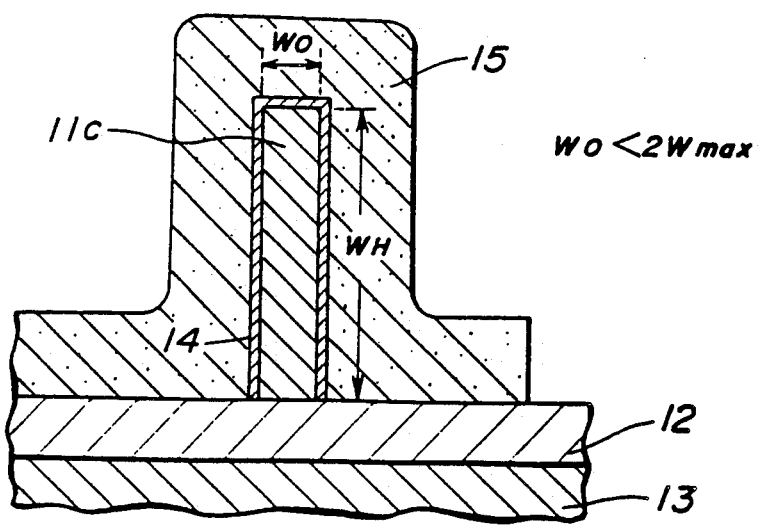
FIG. 5 is a cross sectional view showing an essential part of the MIS transistor of FIG. 4.

FIG. 5 shows the channel region 11c of the silicon body 11 in cross section taken in a plane along the line 5—5' in FIG. 4. Referring to FIG. 5, the channel region 11c is covered with a gate insulator 14 having a thickness of about 100 Å. It should be noted that the channel region 11c has a height $W_H$ and a width $W_O$, in which the width $W_O$ is measured perpendicularly to the gate length GL of the MOS transistor as defined in FIG. 4. In the illustrated example, the width $W_O$ is set to about 0.1 -0.2 μm, and the height $W_H$ is set to about 0.4–0.5 μm. Further, the level of the impurity concentration in the channel region 11c is set to about $3 \times 10^{15}$ cm$^{-3}$. As will be described later, the width $W_O$ is set smaller than twice the maximum extension, $W_{MAX}$, of the depletion region formed in the channel region 11c. Further, a polysilicon gate electrode 15 covers the gate insulator 14. As can be seen in FIG. 4, the gate electrode 15 extends on the insulator 12 generally perpendicularly to a direction of the silicon body 11 extending along a line connecting the source region 11a and the drain region 11b. At an end of the gate electrode 15, there is formed a connection pad 15' for connection to a wiring electrode (not shown).

Figure 6:
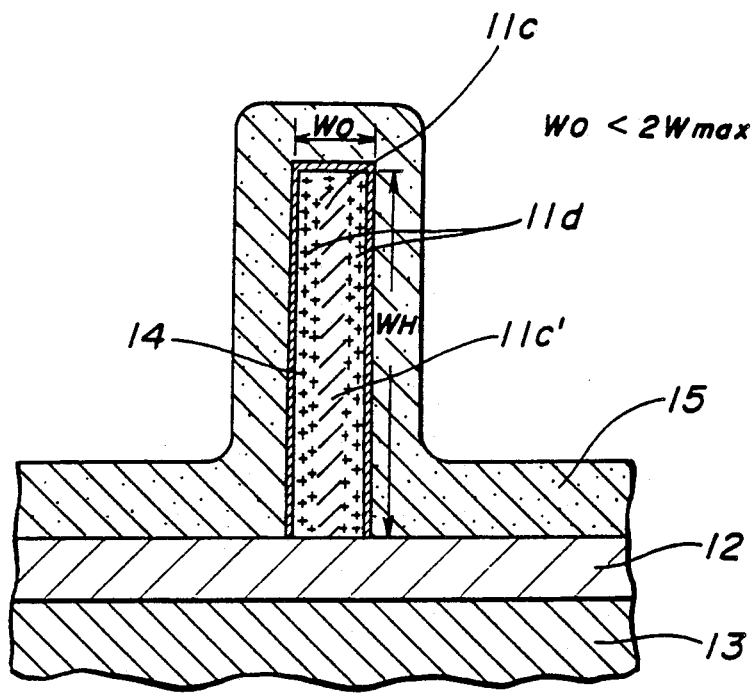
FIG. 6(A) shows the formation of the inversion layer in the MIS transistor of FIG. 4.
FIG. 6(B) shows the formation of the inversion layer in the prior art MIS transistor.
Figure 6:
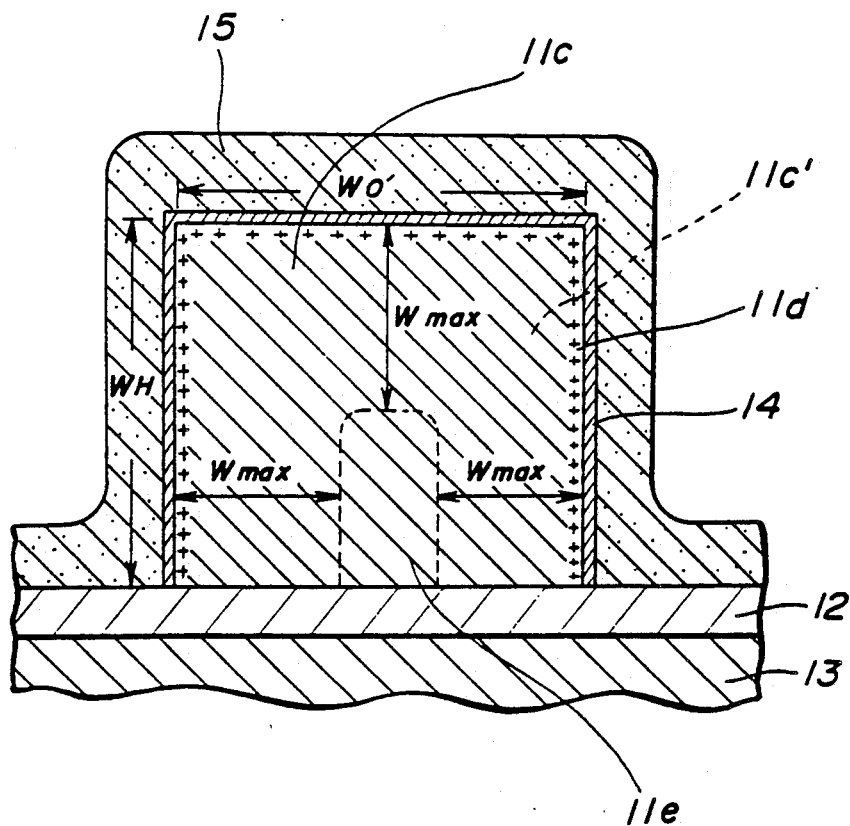

Next, the operation of the MOS transistor of the present invention will be described with reference to FIG. 6(A) in comparison with the prior art structure shown in FIG. 6(B). In FIG. 6(A), parts constructed identically to corresponding parts in the preceding drawings are given identical reference numerals and the description thereof will be omitted. Further, for the sake of comparison, parts in FIG. 6(B) corresponding to parts in FIG. 6(A) are given identical reference numerals.

First, formation of the strong inversion state in the prior art device will be described with reference to FIG. 6(B). In this prior art device, the channel region 11c is made to have a gate width $W_O'$ which is substantially larger than the gate width $W_O$ of the MOS transistor of FIG. 5. Further, it will be assumed that the rest of the device has a construction identical to the device of FIG. 5. Referring to FIG. 6(B), there is formed a depletion region 11c' in the channel region 11c in response to application of a negative voltage on the gate electrode 15. This depletion region 11c' extends further (inwardly) with increasing levels of the voltage on the gate electrode 15, and when the voltage on the gate electrode 15 has reached a threshold voltage Vth of the MOS transistor, the depletion region 11c' reaches a maximum distance $W_{MAX}$ which is determined as a function of the impurity concentration level in the channel region 11c as follows:

$$W_{MAX} = (2K_S \epsilon_o 2\phi_F / qN_D)^{\frac{1}{2}}$$

where $K_S$ is the dielectric constant of silicon, $\epsilon_o$ is the vacuum permittivity, q is a constant equal to $1.60 \times 10^{-19}$ coulomb, $\phi_F$ is a Fermi potential measured from a midpoint in the forbidden band, and $N_D$ is the concentration of the donors in the channel region 11c. It should be noted that the parameter $\phi_F$ is determined by $N_D$. Thus, the maximum extent of the depletion region 11c' is determined once the impurity concentration of the channel region is determined. The following Table I lists some examples of $W_{MAX}$ as a function of $N_D$.

TABLE I

| $N_D$ (cm$^{-3}$) | $W_{MAX}$ (Å) | $\phi_F$ (V) |
|---|---|---|
| $3 \times 10^{15}$ | 5300 | 0.32 |
| $8 \times 10^{16}$ | 1140 | 0.4 |

When the extent of the depletion region reaches the value $W_{MAX}$ there appear holes forming a channel 11d in the channel region 11c along a boundary to the gate insulator 14. With further increase in the gate voltage beyond the threshold voltage Vth, the concentration of holes is increased and the conductance between the source and the drain regions is increased.

It should be noted that in the prior art device of FIG. 6(B), the width $W_O'$ of the channel region 11c exceeds $2W_{MAX}$ and thus there remains a neutral zone 11e at the center of the region 11c. In such a prior art structure, there is no way to increase the conductance of the MOS transistor in the fully turned ON state except for increasing the size of the channel region such as the width $W_O'$ or the height $W_H$ which, however, is contradictory to the requirement of reducing the size of the device.

Next, the operation of the MOS transistor of the present invention will be described with reference to FIG. 6(A). As already described, the essential feature of the present invention is to reduce the width $W_O$ of the channel region 11c to a valve substantially smaller than, i.e., $W_O < 2W_{MAX}$. In other words, the channel region 11c of the silicon body 11 is fully depleted. In the illustrative example of FIG. 6(A), corresponding to the structure of FIG. 5, the gate width $W_O$ is set to 0.1–0.2 μm which is much smaller than $2W_{MAX}$ which in turn is about 1.03 μm ($2 \times 5300$ Å) when a dose of $3 \times 10^{15}$ cm$^{-3}$ is used for the n-type channel region 11c.

In such a structure, the carriers 11d forming the conductive channel in the channel 14a region 11c appear when a voltage much smaller than the threshold voltage $V_{th}$ of the MOS transistor is applied to the gate electrode 15 because of the smaller depletion charge in the depletion region 11c' confined within the channel region 11c. It should be noted that the channel region 11c in the device of the invention (FIG. 6A) has a width $W_O$ which is much smaller than the maximum extent of the depletion region $W_{MAX}$ in a conventional device (FIG. 6B). With further increases in the voltage at the gate electrode 15, the concentration of the carriers 11d in the channel 11c increases because of the sharp rise of the surface potential in the depletion region 11c' confined within the channel region 11c. Such a sharp rise of the surface potential is achieved due to the fact that there arises no increase in the depletion charge with increased levels of the gate voltage in the device of the invention, in view of the fully depleted channel region 11c (FIG. 6A). Thus, the present invention achieves the increase in the conductance of the MOS transistor between the source region 11a and the drain region 11b by reducing the gate width $W_O$ of the transistor (FIG. 6A).

Figure 7:
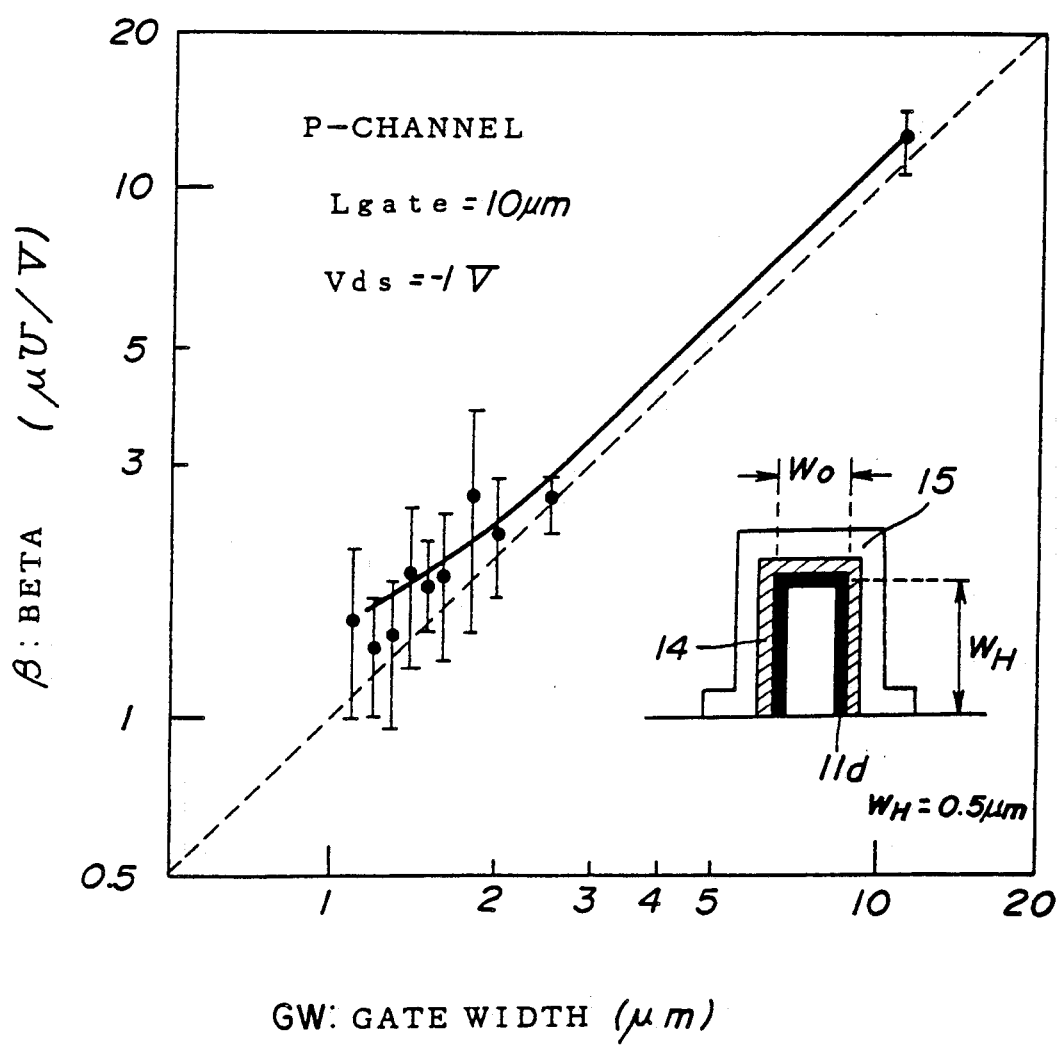
FIG. 7 is a graph showing the change in transistor gain factor in relation to various different total gate widths, for the MIS transistor having the structure shown in FIG. 4.

FIG. 7 shows the result of measurement of the transistor gain factor $\beta$ for the MOS transistor of FIG. 5 with various different total gate widths WG. Here, the total gate width WG is defined as WG $W_O + 2W_H$, as already described. The measurement is made for the structure of FIG. 5 having a gate length GL of 10 μm while applying a voltage of −1 volt between the drain region and the source region. As can be seen in the drawing, the parameter BETA ($\beta$) decreases linearly in logarithmic scale with the decreasing total gate width GW until the total gate width WG reaches about 2 μm.

Once the total gate width WG is decreased below about 2 μm, the gain factor μ starts deviating from the linear trend in an upward direction indicating that the conductance between the source and the channel region increases with decreasing values of the total gate width WG.

Thus, the MOS transistor of the present invention increases the conductance by decreasing the gate width $W_O$ to less than two times the maximum extension of the depletion layer in the channel region ($W_O < 2W_{MAX}$). At the same time, it is desirable to maintain a substantial value of the height $W_H$ in order to maintain an increased level of conductance. Preferably, the height $W_H$ is set relatively to the width $W_O$ so as to satisfy the relation:

$$W_O < 2W_H$$

By choosing the gate width $W_O$ and the gate height $W_H$ as such, one can achieve a substantial value for the total gate length WG even when the gate width $W_O$ is decreased.

Figure 8A:
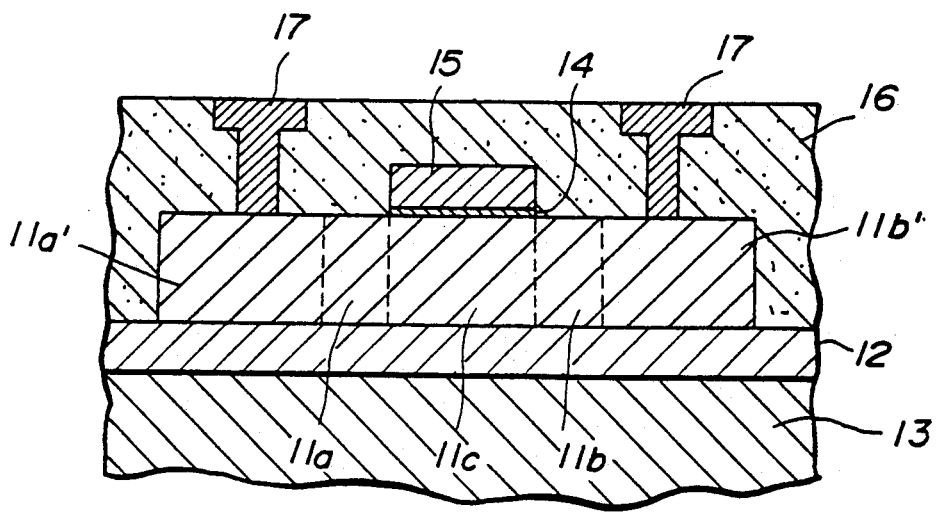
FIGS. 8(A) and (B) are cross sectional views respectively taken in planes along the lines 8(A)—8(A') and 8(B)—8(B') in FIG. 4.
Figure 8B:
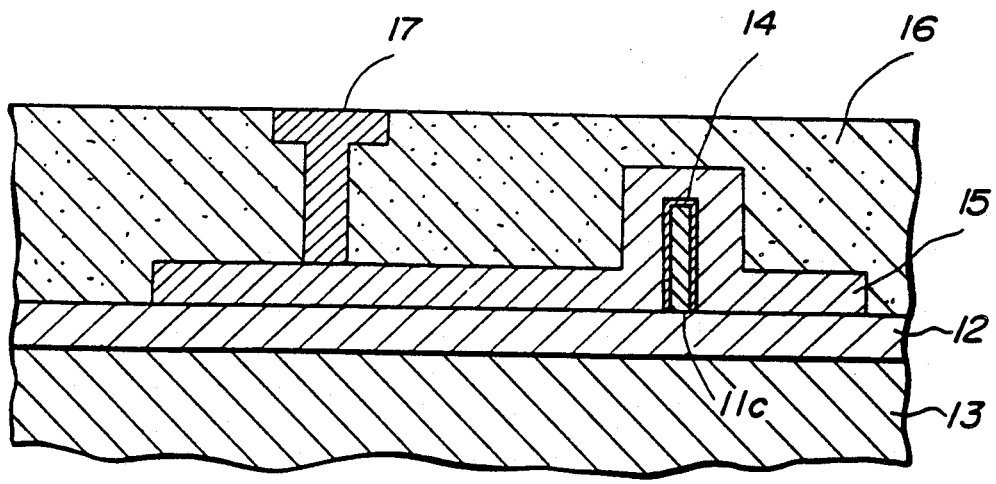

Next, manufacturing of the MOS transistor of FIG. 4 will be described briefly, with further reference to FIGS. 8(A) and 8(B). First, the silicon substrate 13 is oxidized by heating under an atmosphere containing oxygen and the insulator layer 12 having the thickness of about 1.0 μm is formed. Next, a polysilicon layer is deposited on the insulator layer 12 in a thickness of about 0.5 μm. This polysilicon layer is then doped to the n-type and melted by laser irradiation. After cooling, the molten polysilicon is recrystallized into a single crystal film of n-type. Then, this single crystal film of silicon has deposited thereon a photoresist and a pattern of the silicon body 11 is drawn on the photoresist by exposure to electron beam. After the selective removal of the photoresist according to the exposed pattern, the single crystal film of silicon is subjected to anisotropic etching using a mixture of bromine (Br$_2$) and helium (He). After the etching, the remaining photoresist is removed and the silicon body thus formed is subjected to oxidization using a hydrochloric solution. As a result, the gate layer insulator 14 and patterned having a thickness of about 100 Å is formed. After the gate insulator 14 is formed, a polysilicon layer is deposited on the gate insulator 14 and thereby the gate electrode 15 is formed. Further, ion implantation is performed for forming the source region 11a as well as the source contact region 11a' and the drain region 11b as well as the drain contact region 11b', such as by implanting boron fluoride (BF$_2$) with a dose of $2 \times 10^{15}$ cm$^{-2}$ under an acceleration voltage of 40 keV. After the ion implantation, a phosphosilicate glass (PSG) protection layer 16 is provided so as to cover the whole structure of FIG. 4 and wiring electrodes 17 are made to contact with the source contact region 11a', the drain contact region 11b' and the gate contact region 15' as shown in the cross sectional view of FIGS. 8(A) and (B) respectively showing the cross section taken along an X—X' line and a Y—Y' line of FIG. 4.

Although the present invention is described for the p-channel type MOS transistor in the description heretofore, the present invention is by no means limited to the p-channel type MOS transistor but may be applicable to the n-channel type MOS transistor as well.

Figure 9:
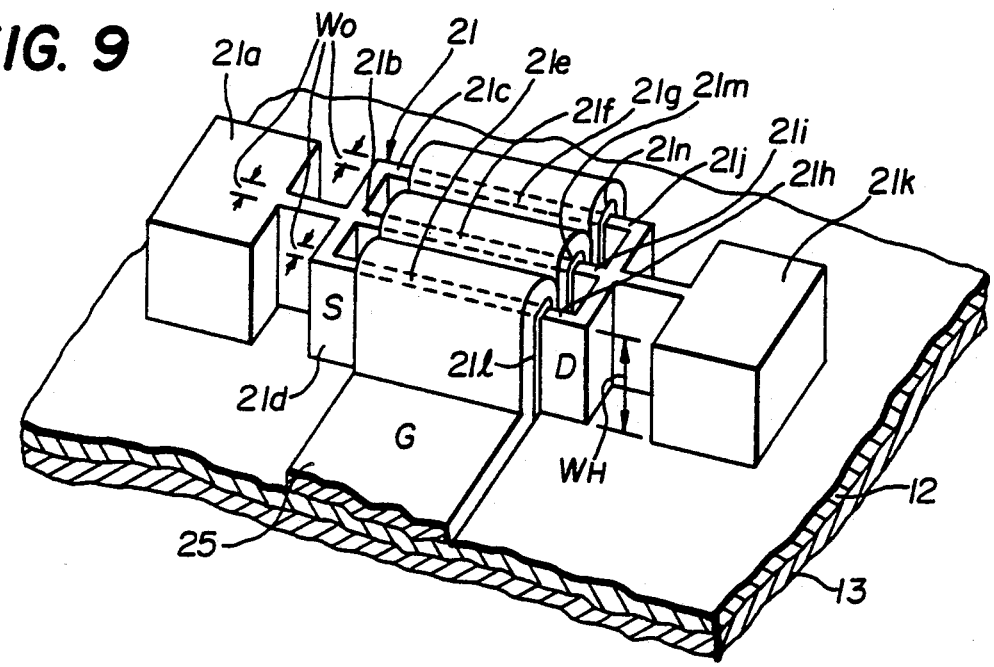
FIG. 9 shows a second embodiment of the MIS transistor of the present invention.

FIG. 9 shows a second embodiment of the MOS transistor of the present invention. In FIG. 9, parts constructed identically to corresponding parts in the preceding drawings are given identical reference numerals and the description thereof will be omitted.

In this embodiment, a silicon body 21 is provided on the insulator layer 12 formed on the silicon substrate 13. The silicon body 21 comprises a contact region 21a, three source regions 21b, 21c and 21d branched from the contact region 21a, three channel parts 21e, 21f and 21g respectively connected to the source regions 21b, 21c and 21d, three drain regions 21h, 21i and 21j respectively connected to the channel regions 21e, 21f and 21g, and another contact region 21k connected to the drain regions 21h, 21i and 21j. The source regions and the drain regions may be doped to the $p^+$-type similarly to the case of the first embodiment, and in this case, the channel regions 21e–21g are doped to the n-type. Further, each of the channel regions 21e–21g are covered with gate insulators 21l, 21m and 21n. Further, a gate electrode 25 is provided on the silicon body 21 so as to make contact with the gate insulators 21l–21n. In this embodiment, the total gate width WG can be increased as a result of the use of the three branched channel regions and the conductance of the MOS transistor is further improved. It should be noted of course that the width $W_O$ for each of the channel regions 21e–21g is set substantially smaller than $2W_{MAX}$, similarly to the case of the first embodiment. As a result, the total gate width WG is in this case represented as $WG = 6W_H + 3W_O$. Further, the number of branches of the source regions, channel regions and the drain regions is not limited to three but may be any desirable number.

It should be noted that the transistors in FIG. 4 and FIG. 9 may be formed directly on a semiconductor body.

Figure 10:
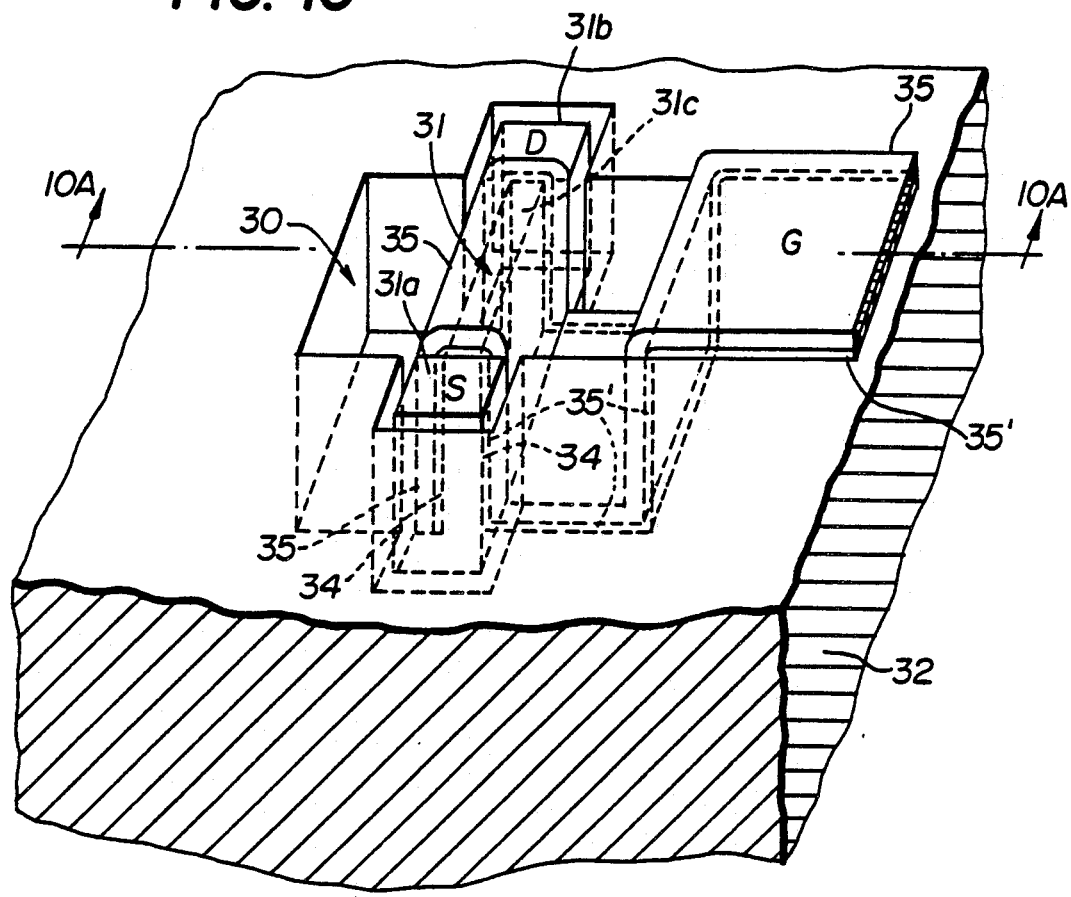
FIG. 10 shows a third embodiment of the MIS transistor of the present invention.
Figure 10A:
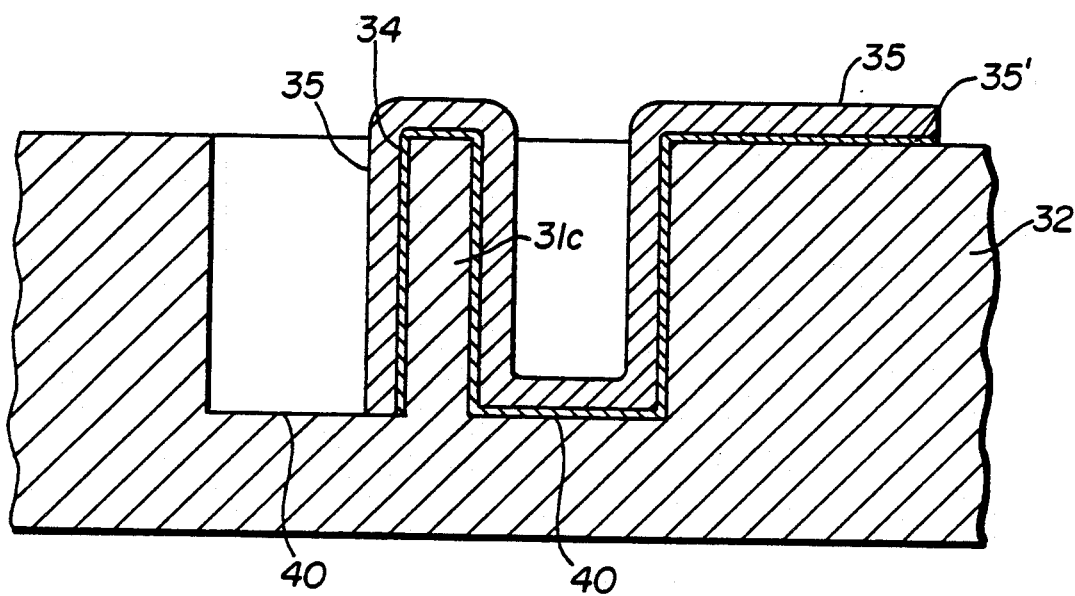

FIG. 10 shows a third embodiment of the MOS transistor of the present invention. In this embodiment, a pit 30 is formed in a silicon substrate 32 except for a part corresponding to a silicon plate 31. In other words, the silicon plate 31 extends upwardly from the bottom of the pit 30. At both ends of the silicon plate 31, a source region 31a and a drain region 31b are formed in continuation with the substrate 32 at the bottom of the pit 30. In other words, the part 31c of the silicon plate 31 between the source region 31a and the drain region 31b acts as the channel region. The silicon plate 31 including the source region 31a and the drain region 31b is isolated from the rest of the substrate 32 by a channel cut layer (not shown in FIG. 10, see FIG. 11) at the bottom of the pit 30 which surrounds the silicon plate 31 and the source and drain regions 31a and 31b. Such a channel cut layer may be formed by a vertical ion implantation of phosphorus for example with a dose of about $3 \times 10^{13} cm^{-2}$. After the formation of the channel cut layer, the entire surface of the silicon plate 31 is oxidized to form a gate insulator film 34. Further, a gate electrode 35 of polysilicon is deposited on the gate insulator film 34. This gate electrode 35 extends along the surface of the substrate 32 defining the bottom wall of the pit 30 and upwardly on the vertical side wall of the pit 30, and thereafter along the upper surface of the substrate 32, with an insulating layer 35' intervening between the gate electrode 35 and the of the pit 30 as well as the upper surface of the substrate 32. Thereafter, the source region 31a and the drain region 31b are doped by an oblique ion implantation using the gate electrode 35 as the mask for the silicon plate 31. According to this embodiment, one can construct the MOS transistor on the silicon substrate directly.

Figure 11:
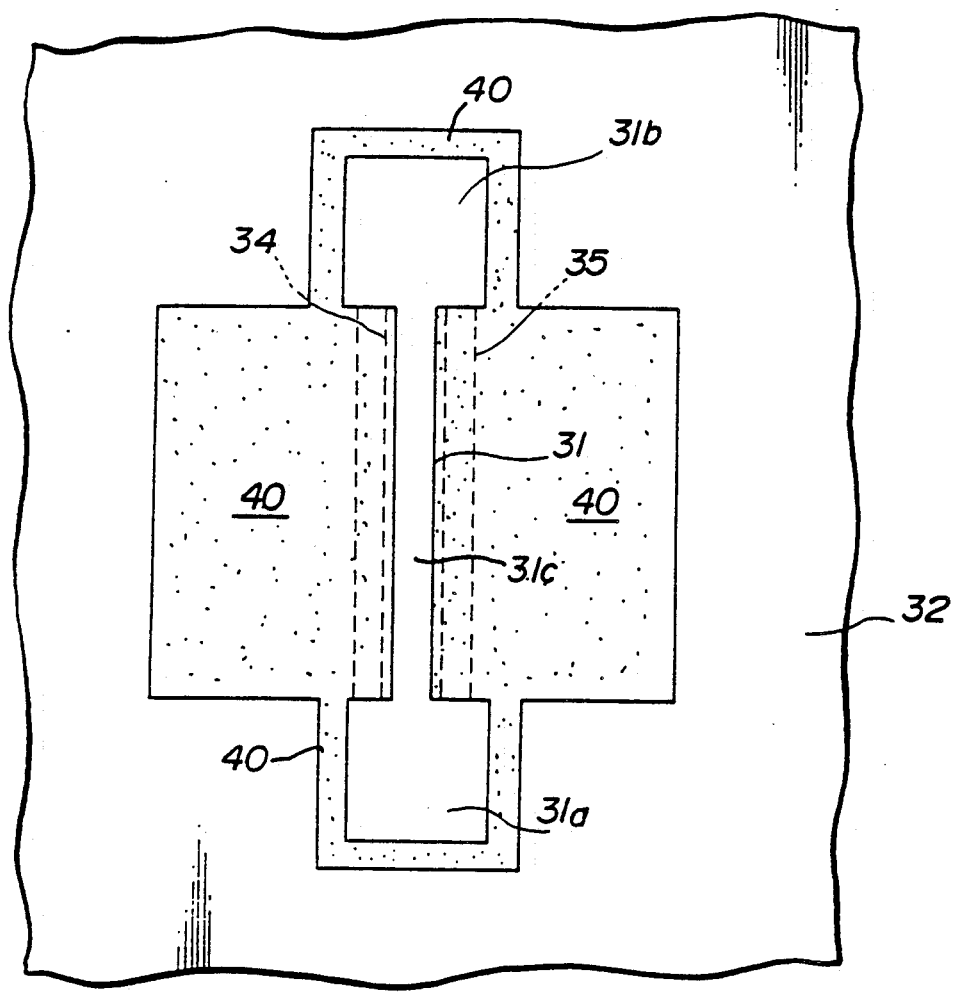
FIG. 11 is a plan, bottom surface view of the MIS transistor of FIG. 10.

FIG. 11 shows a plan view of the MOS transistor of FIG. 10 in the state before the gate insulator 34 and the gate electrode 35 are formed, in which the channel cut layer is shown by a dotted region.

In the description heretofore, it was assumed that the semiconductor substrate is silicon. However, the present invention is not limited as such but silicon carbide may also be used for the semiconductor substrate. Further, as already described, the present invention is not limited to the p-channel type MIS transistor but may be applicable also to the n-channel type transistor. In this case, the channel region is doped to the p-type, the source region is doped to the n-type and the drain region is doped to the n-type.

Further, the present invention is not limited to these embodiments but numerous variations and modifications may be made without departing from the scope of the invention.

What is claimed is:

1. A metal-insulator-semiconductor transistor, comprising:
   a substrate having a main surface;
   a semiconductor body provided on the substrate and having first and second regions doped to a first conductivity type and defining respective source and drain regions and a third region extending in a first direction between and electrically interconnecting the first and second regions and doped to a second conductivity type, opposite to the first conductivity type, the third region defining a channel region for conduction of carriers between the source and drain regions, the third, channel region of the semiconductor body having spaced side wall surfaces extending generally transversely to the main surface of the substrate and an upper surface extending in a plane substantially parallel to the main surface of the substrate, the channel region having a width $W_O$ between the sidewalls measured in a second direction, transverse to the first direction, and a sidewall height of $W_H$;
   a gate insulator film formed on the upper and sidewall surfaces of the third, channel region of the semiconductor body; and
   a gate electrode, of a conducive material, formed on the gate insulator film in conformance with the upper surface and sidewall surfaces of the channel region as covered by the gate insulator film, a gate voltage applied to the gate electrode creating a depletion region in the channel region and wherein, where $W_{MAX}$ defines the maximum extension of the depletion region, in an inward direction from each of the sidewall and upper surfaces of the channel region and in a plane transverse to the first direction and parallel to the second direction, and determined as a function of the impurity concentration level in the channel region, the width $W_O$ of the third channel region is less than the height $W_H$ of the sidewalls thereof and sufficiently smaller than the maximum extension $W_{MAX}$, as so determined, such that the channel region is fully depleted.

2. A metal-insulator-semiconductor transistor as recited in claim 1, wherein the gate width $W_O$ is selected so as to satisfy the relation:

$$W_O < 2W_{MAX}.$$

3. A metal-insulator-semiconductor transistor as recited in claim 2, wherein the height $W_H$ of the channel region is selected to satisfy the relationship:

$$W_O < 2W_H.$$

4. A metal-insulator-semiconductor transistor as recited in claim 1, wherein the height of $W_H$ of the channel region is selected to satisfy the relationship:

$$W_O < 2W_H.$$

5. A metal-insulator-semiconductor transistor as recited in claim 1, wherein said semiconductor body further comprises:
 a source contact region doped to the first conductivity type and connected to the source region; and
 a drain contact region doped to the first conductivity type and connected to the drain region.

6. A metal-insulator-semiconductor transistor as recited in claim 5, further comprising:
 a gate contact area, formed on said substrate at a position displaced from the gate electrode, electrically connected to the gate electrode and affording an electrical connection thereto.

7. A metal-insulator-semiconductor transistor as recited in claim 6, wherein the semiconductor body further comprises:
 plural source regions, each connected to the source contact region;
 plural drain regions, each connected to the drain contact region;
 plural channel regions respectively extending in the first direction between and electrically interconnecting the respective, plural source and drain regions,
 plural gate insulator films, each gate insulator film covering the upper and sidewall surfaces of a respective channel region; and
 a common gate electrode formed on and covering the plural gate insulator films, in conformance with the upper and sidewall surfaces of the respective channel regions.

8. A metal-insulator-semiconductor transistor as recited in claim 1, in which said substrate comprises an insulator material.

9. A metal-insulator-semiconductor transistor as recited in claim 1, in which said substrate comprises a semiconductor material.

10. A metal-insulator-semiconductor transistor as recited in claim 1, wherein:
 said substrate comprises a silicon oxide layer formed on a silicon substrate;
 said semiconductor body comprises silicon;
 said gate insulator film comprises silicon oxide; and
 said gate electrode comprises polysilicon.

11. A metal-insulator-semiconductor transistor, comprising:
 a semiconductor substrate having an upper, main surface and a pit formed therein extending into the substrate from the upper, main surface thereof and defining spaced sidewalls and a bottom wall of the pit within the substrate;
 a semiconductor plate comprising a portion of the substrate extending upwardly from the bottom wall of the pit and spaced from the pit sidewalls, said semiconductor plate comprising first and second end regions, each doped to a first conductivity type and respectively defining source and drain regions and a third region, extending a first direction between and electrically interconnecting the first and second regions and doped to a second conductivity type, opposite to the first conductivity type, and defining a channel region, the channel region having an upper surface and a pair of spaced, sidewall surfaces respectively spaced from the pit sidewall surfaces;
 a gate insulator film formed on the upper and sidewall surfaces of the third, channel region of the semiconductor plate thereby to cover the corresponding sidewall and upper surfaces of the channel region; and
 a gate electrode, of a conducive material, formed on the gate insulator film and extending on the gate insulator film in conformance with the upper surface and sidewall surfaces of the channel region as covered by the gate insulator film, a gate voltage applied to the gate electrode creating a depletion region in the channel region and wherein, where $W_{MAX}$ defines the maximum extension of the depletion region, in an inward direction from each of the sidewall and upper surfaces of the channel region in a plane transverse to the first direction, and determined as a function of the impurity concentration level in the channel region, the width $W_O$ of the channel region is sufficiently smaller than the maximum extension $W_{MAX}$, as so determined, such that the channel region is fully depleted.

12. A metal-insulator-semiconductor transistor as recited in claim 11, wherein said semiconductor plate is isolated from the substrate by a channel cut region doped to the second conductivity type and formed around the semiconductor plate at the bottom wall of the pit.

13. A metal-insulator-semiconductor transistor as recited in claim 11, wherein:
 the pit is defined by a pair of spaced, interior sidewalls of the substrate extending substantially parallel to and spaced from the respective sidewalls of the channel region and from the bottom wall of the pit to the main surface of the substrate; and
 the gate electrode further includes a first integral portion extending from the channel region of the plate at the bottom wall of the pit, along the surface of the bottom wall of the pit adjacent at least one of the channel region sidewalls and from the bottom wall of the pit and along the corresponding sidewall of the pit to the main surface of the substrate and a second integral portion extending from the second integral portion along the main surface of the substrate and forming a gate contact area.

* * * * *

UNITED STATES PATENT AND TRADEMARK OFFICE
CERTIFICATE OF CORRECTION

PATENT NO. :   4,996,574

DATED      :   February 26, 1991

INVENTOR(S) :  Masahiro SHIRASAKI

It is certified that error appears in the above-identified patent and that said Letters Patent is hereby corrected as shown below:

Col. 1,  line 11, change "uses" to --use--;
         line 60, after "gate" insert --,--.

Col. 2,  line 5, after "source and" insert --the drain regions, one has to increase either the size--;
         line 46, after "resulting" insert --,--;
         line 65, delete "which is", and after "drain region" insert --which is--.

Col. 3,  line 19, delete "a" (second occurrence);
         line 36, change "8(A)-8(A')" to --8(A)-8(A)'--;
         line 37, change "8(B)-8(B')" to --8(B)-8(B)'--;
         line 47, delete "..".

Col. 4,  line 2, delete "forming";
         line 15, change "cm$^{31\ 3}$" to --cm$^{-3}$--;
         line 21, after "insulator" insert --layer--.

Col. 5,  line 27, after "than" insert --2W$_{MAX}$,--;
         line 36, delete "14a" and insert --region 11c--.
         line 61, after "WG" (second occurrence) insert --=--
         line 68, change "GW" to --WG--.

UNITED STATES PATENT AND TRADEMARK OFFICE
CERTIFICATE OF CORRECTION

PATENT NO. : 4,996,574

DATED : February 26, 1991

INVENTOR(S) : Masahiro SHIRASAKI

It is certified that error appears in the above-identified patent and that said Letters Patent is hereby corrected as shown below:

Col. 6, line 2, change "$\mu$" to --$\beta$--;
line 42, delete "and patterned";
line 45, after "insulator 14" insert --is formed, a polysilicon layer is deposited on the gate insulatore 14 and patterned--;
line 59, change "X-X" to --8(A)-8(A)'--;
line 60, change "Y-Y" to --8(A)-8(A)'--.

Col. 7, line 62, after "35 and the" insert --bottom and side walls--.

Col. 9, line 35, change "," to --;--.

Col. 10, line 22, change "conducive" to --conductive--;
line 59, change "second integral portion" to --first integral portion--.

Signed and Sealed this

Tenth Day of August, 1993

Attest:

MICHAEL K. KIRK

Attesting Officer

Acting Commissioner of Patents and Trademarks

UNITED STATES PATENT AND TRADEMARK OFFICE
CERTIFICATE OF CORRECTION

PATENT NO. : 4,996,574
DATED : February 26, 1991
INVENTOR(S) : SHIRASAKI

It is certified that error appears in the above-indentified patent and that said Letters Patent is hereby corrected as shown below:

Col. 5, line 36, please correct the line to read as follows: --ductive channel in the channel region 11c appear--.

Signed and Sealed this

Twentieth Day of December, 1994

BRUCE LEHMAN

Attest:

Attesting Officer

Commissioner of Patents and Trademarks